(12) United States Patent
Grossnickle et al.

(10) Patent No.: US 10,582,603 B2
(45) Date of Patent: *Mar. 3, 2020

(54) OPTICAL RESONATORS THAT UTILIZE PLASMA CONFINEMENT OF A LASER GAIN MEDIA

(71) Applicant: The Boeing Company, Chicago, IL (US)

(72) Inventors: James A. Grossnickle, Bellevue, WA (US); Dejan Nikic, Seattle, WA (US)

(73) Assignee: The Boeing Company, Chicago, IL (US)

( * ) Notice: Subject to any disclaimer, the term of this patent is extended or adjusted under 35 U.S.C. 154(b) by 3 days.

This patent is subject to a terminal disclaimer.

(21) Appl. No.: 15/986,201

(22) Filed: May 22, 2018

(65) Prior Publication Data
US 2019/0364655 A1 Nov. 28, 2019

(51) Int. Cl.
| | |
|---|---|
| *H01S 3/038* | (2006.01) |
| *H05H 1/06* | (2006.01) |
| *H05H 1/48* | (2006.01) |
| *H01S 3/032* | (2006.01) |
| *H01S 3/225* | (2006.01) |
| *H01S 3/036* | (2006.01) |
| *H01S 3/097* | (2006.01) |

(52) U.S. Cl.
CPC .............. *H05H 1/06* (2013.01); *H01S 3/036* (2013.01); *H01S 3/0326* (2013.01); *H01S 3/0381* (2013.01); *H01S 3/0382* (2013.01); *H01S 3/0385* (2013.01); *H01S 3/097* (2013.01); *H01S 3/225* (2013.01); *H05H 1/48* (2013.01)

(58) Field of Classification Search
CPC .... H01S 3/0326; H01S 3/0381; H01S 3/0382; H01S 3/0385; H01S 3/0346
See application file for complete search history.

(56) References Cited

U.S. PATENT DOCUMENTS

| | | | | |
|---|---|---|---|---|
| 4,720,832 A | * | 1/1988 | Deki | H01S 3/0346 372/109 |
| 4,974,228 A | * | 11/1990 | Petersen | H01S 3/0326 372/37 |

(Continued)

FOREIGN PATENT DOCUMENTS

| | | |
|---|---|---|
| JP | S60124342 A | 7/1985 |
| JP | S61292842 A | 12/1986 |

OTHER PUBLICATIONS

E. Eberl et al; XUV-Amplification in an argon z-pinch plasma; Elsevier Science B. V.; 1998.

(Continued)

*Primary Examiner* — Michael Carter
(74) *Attorney, Agent, or Firm* — Duft & Bornsen, PC

(57) ABSTRACT

Laser amplification utilizing plasma confinement of a gas laser gain media is described. The gas laser gain media is compressed into plasma utilizing a self-reinforcing magnetic field referred to a plasma pinch (e.g., a flow stabilized z-pinch). In the plasma pinch, the gas laser gain media is compressed to a high density, which improves the gain of the media. An optical resonator partially surrounds the plasma pinch and utilizes the laser gain media compressed within the plasma pinch to generate an output of coherent light.

23 Claims, 13 Drawing Sheets

(56) References Cited

U.S. PATENT DOCUMENTS

| | | | | |
|---|---|---|---|---|
| 5,359,621 A * | 10/1994 | Tsunoda | ................ | H01S 3/0975 |
| | | | | 372/55 |
| 7,679,025 B1 | 3/2010 | Krishnan et al. | | |
| 7,984,539 B2 * | 7/2011 | Fujimoto | ............ | H01S 3/10092 |
| | | | | 29/402.01 |
| 10,141,711 B2 * | 11/2018 | Clemen, Jr. | ........... | H01S 3/0326 |

OTHER PUBLICATIONS

European Search Report; EP17164803; dated Sep. 8, 2017.
F. Douglas Witherspoon; A contoured gap coaxial plasma gun with injected plasma armature; Review of Scientific Instruments 80 083506; 2009.
H. Ito et al; Angular Distribution Measurements of Energy Spectra of Protons Emitted From Hydrogen Plasma Focus; University of Toyama, Japan; 2014.
S. R. Mohanty et al; Miniature hybrid plasma focus extreme ultraviolet source driven by 10 kA fast current pulse; Review of Scientific Instruments 77 043506; 2006.
Yuanli Cheng et all; Observation of Soft X-ray Amplification in Ne-Like Ar by a Capillary Discharge; 2005.
U.S. Appl. No. 15/092,909.

* cited by examiner

OPTICAL RESONATORS THAT UTILIZE PLASMA CONFINEMENT OF A LASER GAIN MEDIA

FIELD

This disclosure relates to the field of lasers and in particular, to providing high density gain mediums for lasers utilizing plasma confinement.

BACKGROUND

A laser is a device that emits light through a process of optical amplification using stimulated emissions of electromagnetic radiation. The term "laser" is an acronym based on this process and refers to "light amplification by stimulated emission of radiation." The first lasers were built in the 1960's. Lasers differ from other sources of light in that they emit coherent light. Coherent light is a beam of photons that have the same wavelength and phase.

Lasers utilize what is referred to as a laser gain media to amplify light. A laser gain media adds optical energy to the light that traverses through the media through a process called pumping. Pumping may utilize electrical currents (referred to as electrical pumping) or light inputs (referred to as optical pumping) to generate photons. In either case, the laser gain media is pumped to an excited state, which then transitions to a rest state and emits photons. It is the state transitions that provide the amplification or gain capabilities to the laser gain media.

The amount of optical power that a laser produces may be limited by a number of factors that depend on the type of laser gain media in use. For crystal lasers, the amount of power may be limited by the heat density of the crystal. For gas lasers, the amount of power may be limited by the low energy density of the excited state of the gas.

It is desirable for certain applications that lasers operate at a high power, which can be difficult to achieve given the constraints of heat density limitations and/or energy density limitations for crystal lasers and gas lasers, respectively. Thus, there is a desire to further improve the power output of lasers given these constraints.

SUMMARY

Embodiments described herein provide high power laser outputs utilizing plasma confinement of a gas laser gain media. The gas laser gain media is compressed into plasma utilizing a self-reinforcing magnetic field referred to a plasma pinch (e.g., a flow stabilized z-pinch). In the plasma pinch, the gas laser gain media is compressed to a high density, which improves the gain of the media. An optical resonator partially surrounds the plasma pinch and utilizes the laser gain media compressed within the plasma pinch to generate an output of coherent light.

One embodiment comprises an apparatus that includes a plasma confinement device and an optical resonator. The plasma confinement device generates a plasma pinch of at least one gas of a laser gain media. The optical resonator partially surrounds the plasma pinch and utilizes the laser gain media compressed within the plasma pinch to generate an output of coherent light.

Another embodiment comprises a method of amplifying coherent light utilizing a plasma pinch. The method comprises generating a plasma pinch of at least one gas of a laser gain media. The method further comprises generating an output of coherent light utilizing an optical resonator that partially surrounds the laser gain media compressed within the plasma pinch.

Another embodiment comprises an apparatus that includes an outer electrode in the form of a hollow cylinder that has an end with an opening. The apparatus further includes an inner electrode in the form of a hollow cylinder that is centered with an interior of the outer electrode. The apparatus further includes at least one gas supply that provides a laser gain media to the interior, and a power source. The power source is electrically coupled to the outer electrode and the inner electrode and generates an electric arc between the outer electrode and the inner electrode. The electric arc travels along an interior surface of the outer electrode towards the opening to form a plasma pinch between the inner electrode and the opening. The apparatus further includes a reflective mirror proximate to the inner electrode, and a partially reflective mirror proximate to the opening that is optically coupled to the reflective mirror. The apparatus further includes a first magnetic shield proximate to the reflective mirror that generates a magnetic field and directs ionized laser gain media away from the reflective mirror. The apparatus further includes a second magnetic shield proximate to the partially reflective mirror that generates a magnetic field and directs the ionized laser gain media away from the partially reflective mirror.

The features, functions, and advantages that have been discussed can be achieved independently in various embodiments or may be combined in yet other embodiments, further details of which can be seen with reference to the following description and drawings.

DESCRIPTION OF THE DRAWINGS

Some embodiments are now described, by way of example only, and with reference to the accompanying drawings. The same reference number represents the same element or the same type of element on all drawings.

DETAILED DESCRIPTION

The figures and the following description illustrate specific exemplary embodiments. It will be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure are to be construed as being without limitation. As a result, this disclosure is not limited to the specific embodiments or examples described below, but by the claims and their equivalents.

Figure 1:
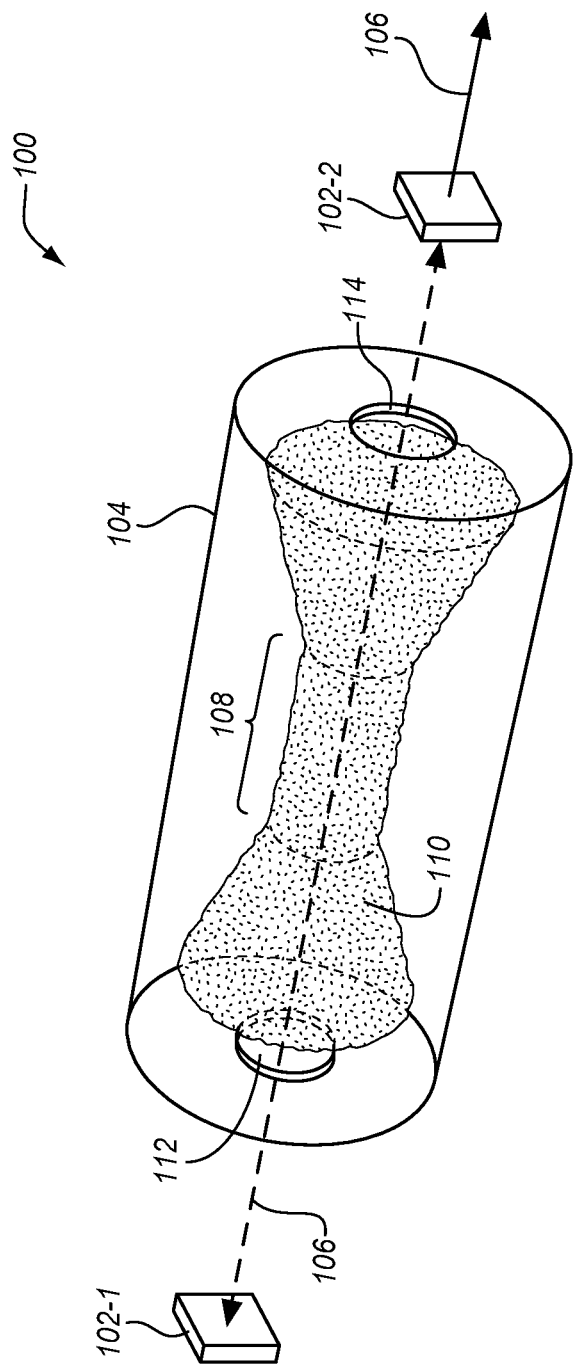
FIG. 1 illustrates a system that utilizes plasma confinement for laser gain-amplification in an illustrative embodiment.

FIG. 1 illustrates a system 100 that utilizes plasma confinement for laser gain-amplification in an illustrative embodiment. In this embodiment, system 100 includes an optical resonator 102 and a plasma confinement device 104. Optical resonators are sometimes referred to as optical cavities, resonating cavities, or laser cavities. Optical resonators utilize an arrangement of mirrors that form a standing wave for coherent light waves. Optical resonators surround a laser gain medium, with coherent light confined within the optical resonators reflecting multiple times between the mirrors and through the laser gain medium. Each pass of the coherent light through the laser gain medium provides some amplification to the coherent light.

Coherent light confined in optical resonators will reflect multiple times through the laser gain medium, and due to the effects of interference, certain patterns and frequencies of the coherent light are sustained by the optical resonators. In general, the stable patterns are the eigenmodes of the optical resonators. The use of optical resonators with laser gain mediums typically provides a higher power output than a single pass amplification system, due to the multiple passes of the coherent light through the laser gain medium. Typically, both reflective and partially reflective mirrors are used by an optical resonator, with coherent light being emitted from an optical resonator through the partially reflective mirror. The partially reflective mirror portion of an optical resonator is sometimes referred to as an output coupler.

With respect to FIG. 1, optical resonator 102 comprises any component, system, or device that forms a standing wave cavity resonator for coherent light 106. In this embodiment, optical resonator 102 includes a reflective mirror 102-1 and a partially reflective mirror 102-2. Coherent light 106 within optical resonator 102 is reflected multiple times between reflective mirror 102-1 and partially reflective mirror 102-2 before being output from optical resonator 102.

Coherent light 106 comprises photons that share a substantially similar phase and wavelength. Coherent light 106 that is output by optical resonator 102 is amplified by a plasma pinch 108 that is generated by plasma confinement device 104. For instance, optical resonator 102 partially surrounds plasma pinch 108, which comprises a compressed laser gain media 110. Coherent light 106 between reflective mirror 102-1 and partially reflective mirror 102-2 reflects back and forth through plasma pinch 108 and is amplified by laser gain media 110. In this embodiment, plasma confinement device 104 includes an input 112 proximate to reflective mirror 102-1 and an output 114 proximate to partially reflective mirror 102-2. Coherent light 106 reflected by reflective mirror 102-1 enters input 112 of plasma confinement device 104, traverses through and is amplified by plasma pinch 108, exits output 114 of plasma confinement device 104, and is reflected by partially reflective mirror 102-2 back towards reflective mirror 102-1. Coherent light 106 is amplified by plasma pinch 108 as coherent light 106 is reflected back and forth between reflective mirror 102-1 and partially reflective mirror 102-2. When coherent light 106 reaches a particular optical power that is defined by the construction of partially reflective mirror 102-2, coherent light 106 is output from optical resonator 102.

Plasma pinch 108 is a highly compressed region of laser gain media 110, which comprises one or more gases. Some examples of laser gain media 110 include helium, neon, argon, nitrogen, iodine, and combinations thereof. Laser gain media 110 may also form a high-powered excimer laser in some embodiments. Excimer lasers typically use a combination of a noble gas (e.g., argon, krypton, or xenon) and a reactive gas (e.g., fluorine or chlorine). Under electrical stimulation and high pressure, a pseudo-molecule called an excimer (or in the case of noble gas halides, an exciplex) is created. The excimer or exciplex exists in an energized state and can give rise to laser light (e.g., in the ultraviolet range).

Plasma pinch 108 may also form a sheared-flow stabilized z-pinch in some embodiments. Sheared flow stabilization can be used to stabilize what is generally an unstable z-pinch without close-fitting walls or axial magnetic fields. Sheared flow stabilization utilizes the flow of one or more gases proximate to the z-pinch to increase the time of stability for plasma pinch 108.

Figure 2:
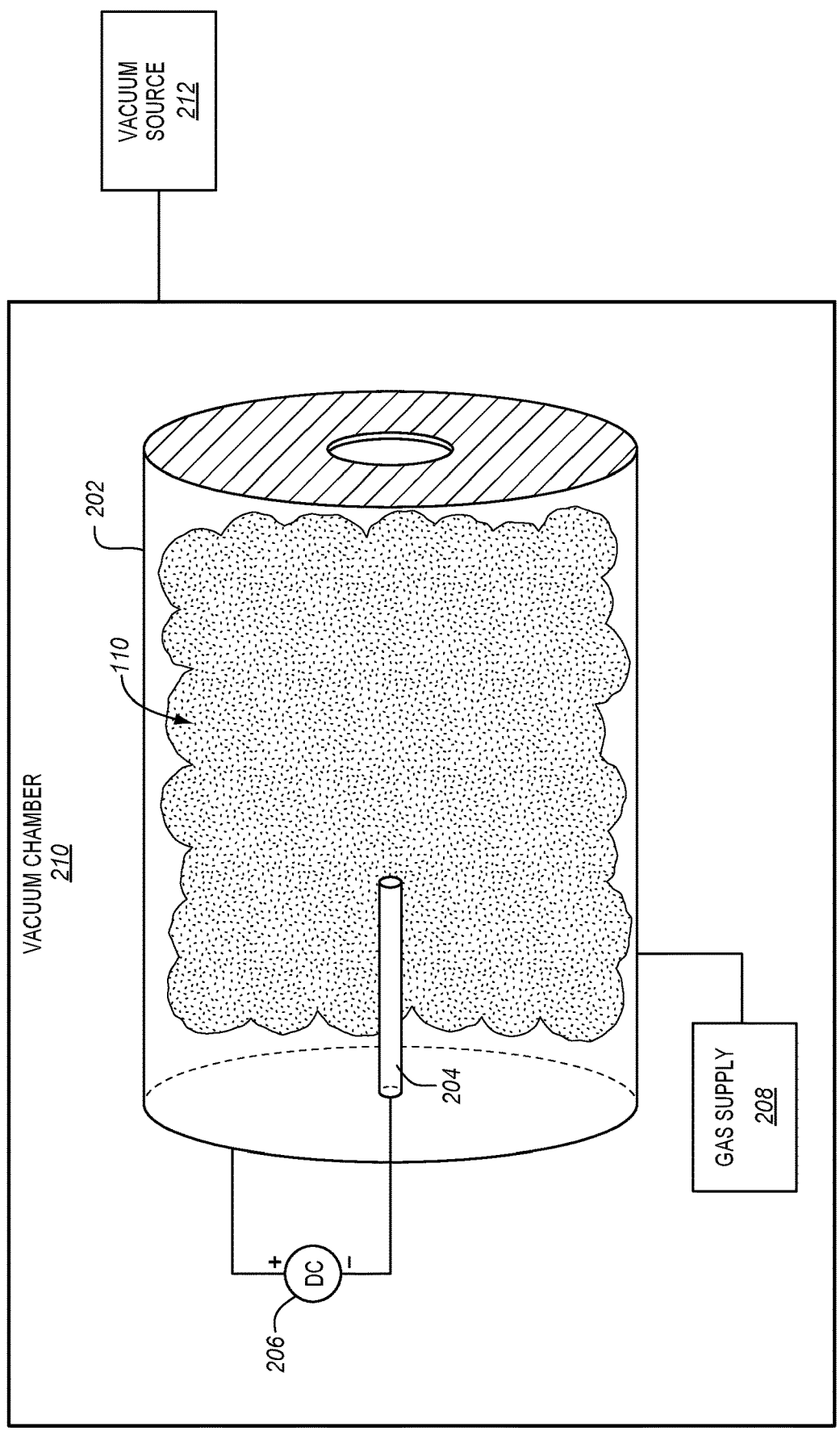
FIG. 2 illustrates additional details for the plasma confinement device of FIG. 1 in an illustrative embodiment.

FIG. 2 illustrates additional details for plasma confinement device 104 of FIG. 1 in an illustrative embodiment. In this embodiment, plasma confinement device 104 includes an outer electrode 202, which comprises a hollow cylinder. Plasma confinement device 104 further includes an inner electrode 204 that is within outer electrode 202, and a power source 206 that is electrically coupled to both outer electrode 202 and inner electrode 204. Power source 206 comprises any component, system, or device that provides a voltage differential across outer electrode 202 and inner electrode 204 sufficient to generate an electric arc through laser gain media 110. In some embodiments, system 100 includes a vacuum chamber 210 that surrounds outer electrode 202. A vacuum source 212 draws a vacuum on vacuum chamber 210. Vacuum chamber 210 may be used to prevent the introduction of atmospheric gases into the interior of outer electrode 202. Inner electrode 204 may be located at approximately the center of outer electrode 202 in some embodiments.

FIG. 2 also illustrates a gas supply 208 that may provide laser gain media 110 to the interior of outer electrode 202 in some embodiments. In some embodiments, gas supply 208 may provide laser gain media 110 to the interior of outer electrode 202 in response to a control signal. For instance, gas supply 208 may be provided to the interior of outer electrode 202 at approximately the same time as power source 206 generates the voltage differential.

Figure 3:
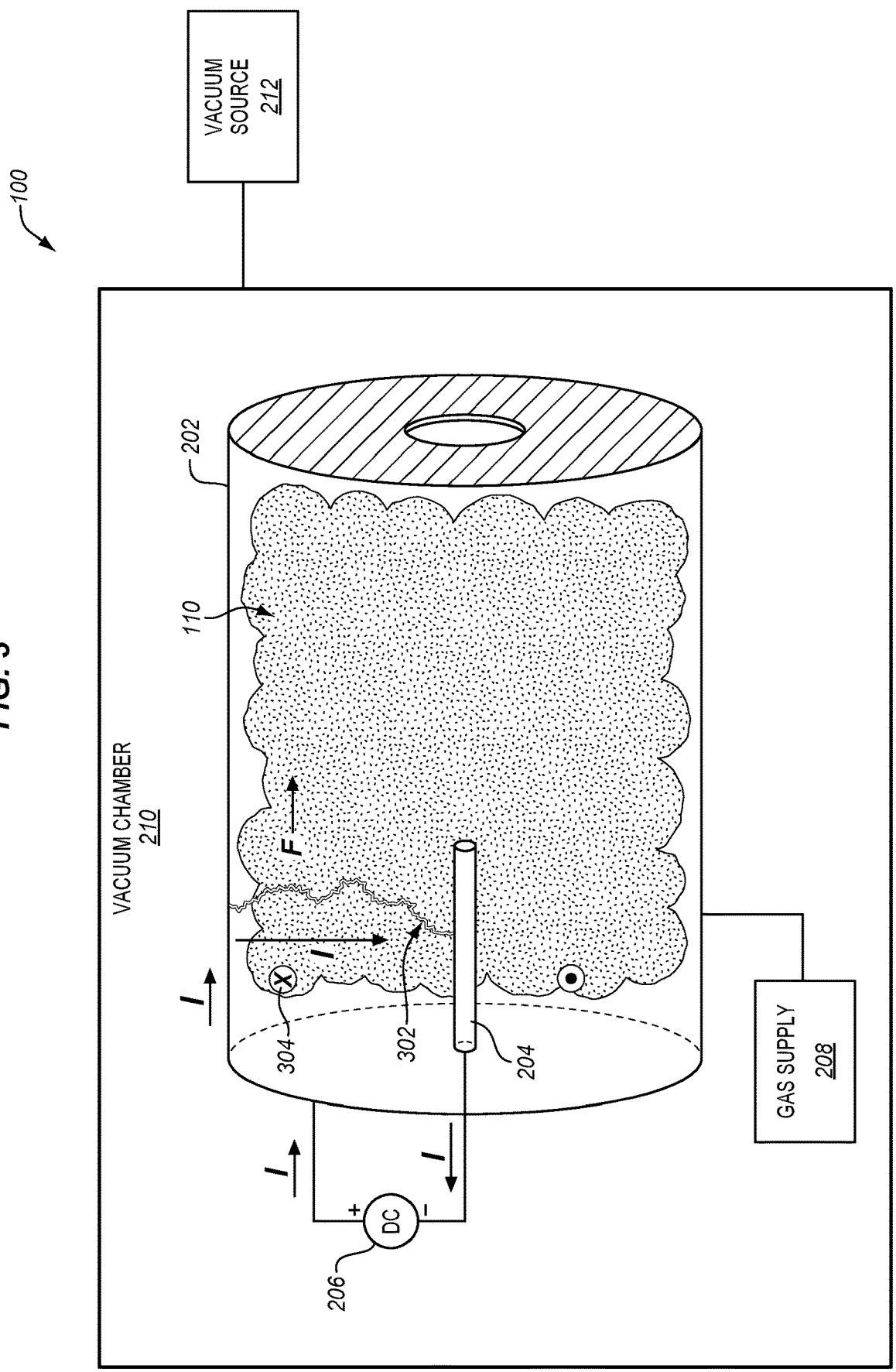
FIG. 3 illustrates an electric arc formed between an outer electrode and inner electrode for the plasma confinement device illustrated in FIG. 2 in an illustrative embodiment.
Figure 4:
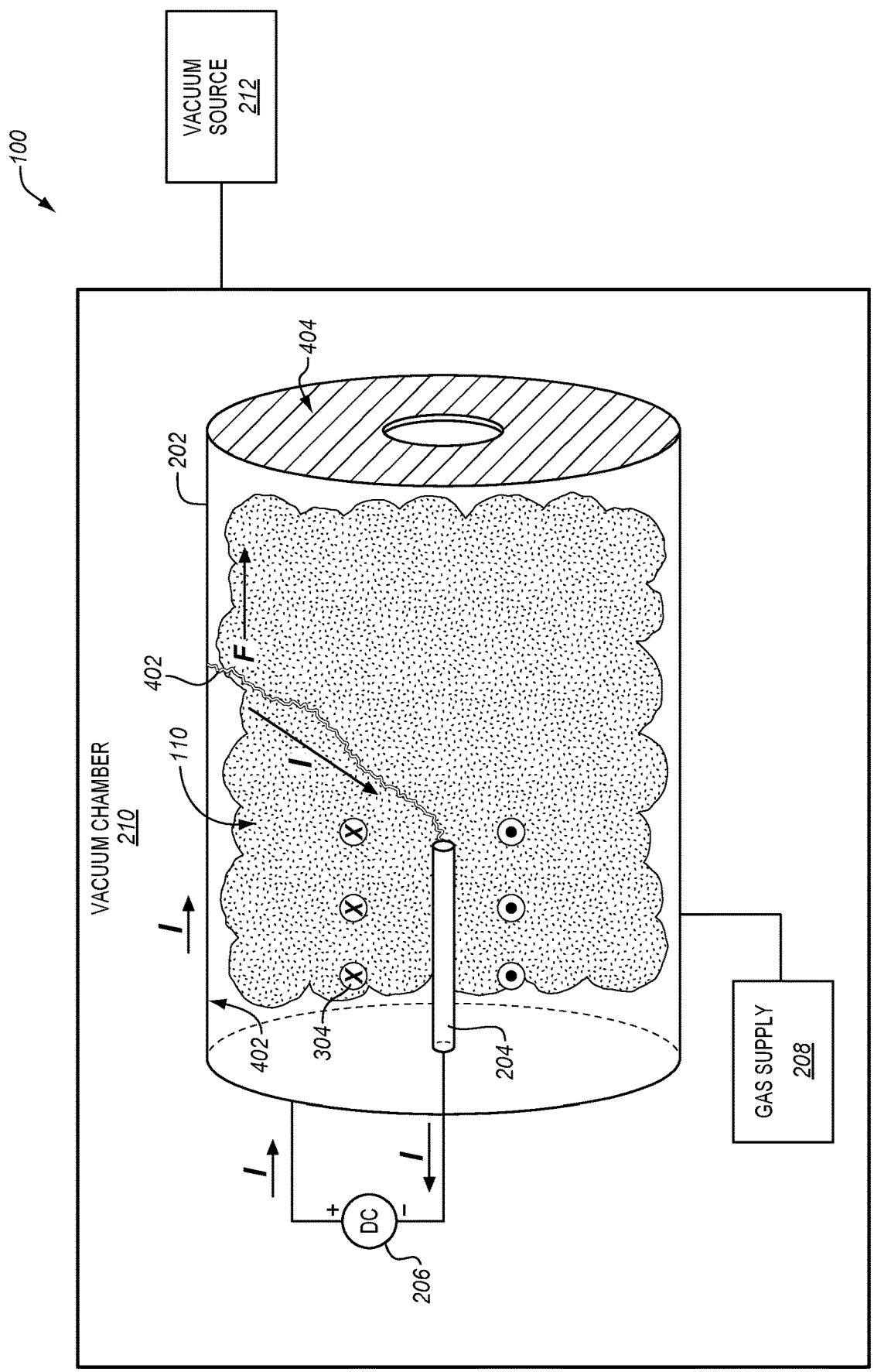
FIG. 4 illustrates the electric arc as it travels along an interior surface of the outer electrode in an illustrative embodiment.

In response to power source 206 applying a high voltage differential across outer electrode 202 and inner electrode 204, an electric arc forms through laser gain media 110. FIG. 3 illustrates an electric arc 302 formed between outer electrode 202 and inner electrode 204 in an illustrative embodiment. Electric arc 302 supports a current (I), which is supplied by power source 206. The current flowing through electric arc 302 generates a magnetic field 304. The Lorentz force (F) pushes electric arc 302 in the direction indicated by the arrow in FIG. 3. Electric arc 302 travels along an interior surface of outer electrode 202 (not shown in this view) in the direction of the force. FIG. 4 illustrates electric arc 302 as it travels along an interior surface 402 of outer electrode 202 in an illustrative embodiment. Electric arc 302 is illustrated as travelling towards an end 404 of outer electrode 202.

Figure 5:
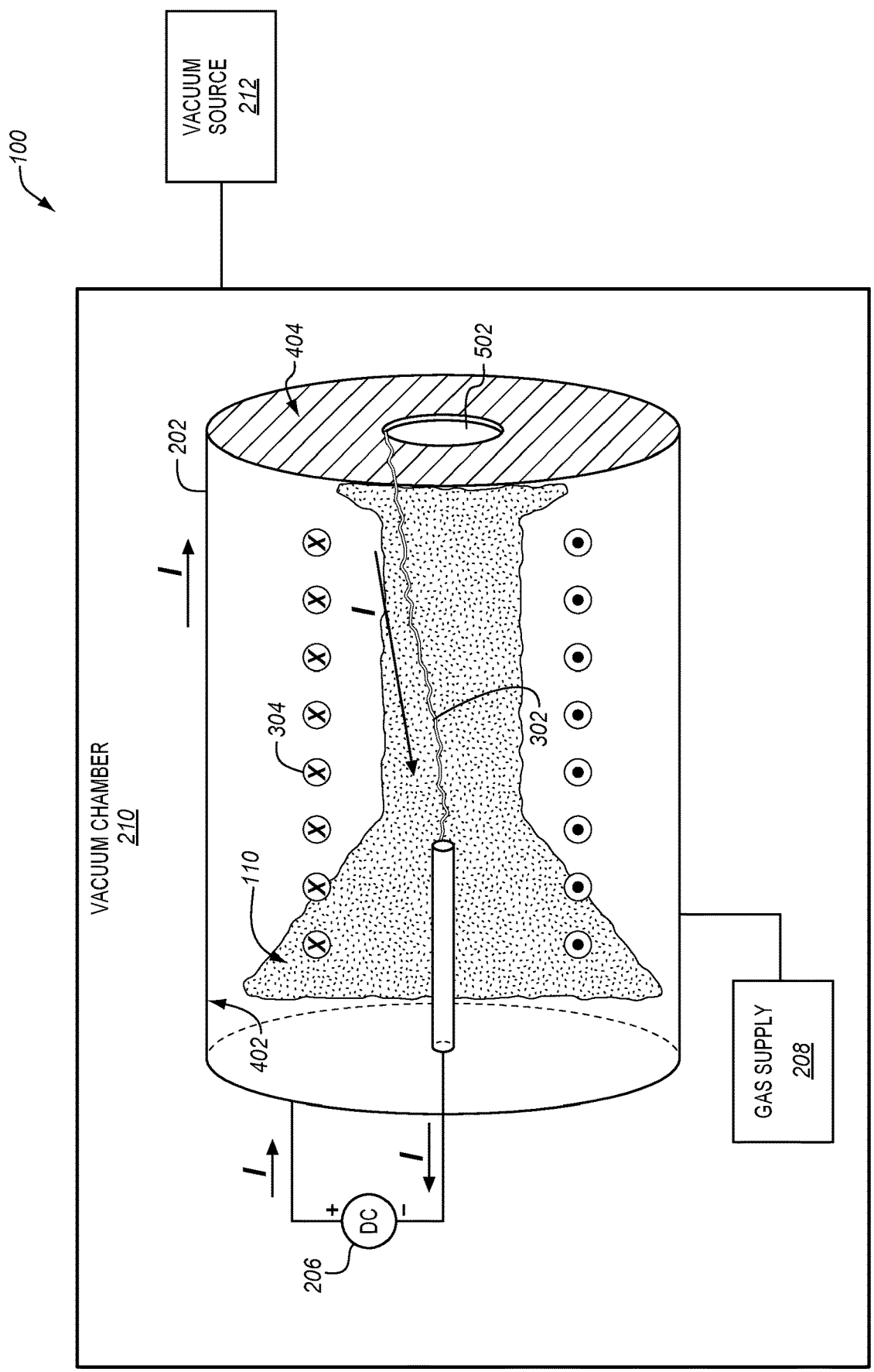
FIG. 5 illustrates an initial formation of a plasma pinch in an illustrative embodiment.

FIG. 5 illustrates an initial formation of plasma pinch 108 in an illustrative embodiment. Magnetic field 304 compresses the plasma formed from laser gain media 110 in the region between inner electrode 204 and an opening 502 in end 404 of outer electrode 202. The compressed plasma becomes very hot and very dense. As the current through plasma pinch 108 increases, the strength of magnetic field 304 increases, and the compression becomes self-reinforcing.

Figure 6:
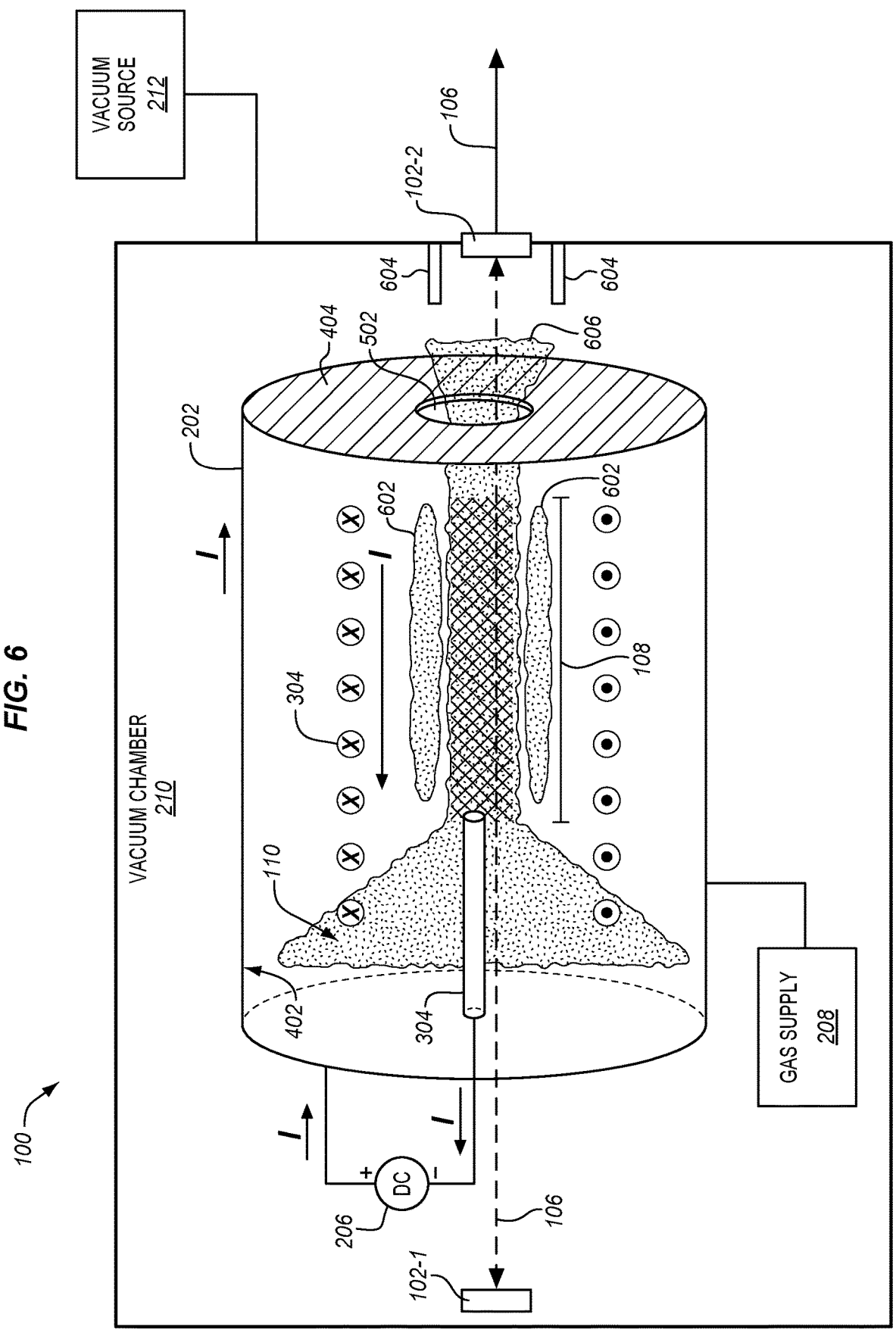
FIG. 6 illustrates the final formation of the plasma pinch in an illustrative embodiment.

FIG. 6 illustrates the final formation of plasma pinch 108 in an illustrative embodiment. Plasma pinch 108 is formed from laser gain media 110 that is highly compressed and provides optical amplification to coherent light 106. In other embodiments, the highly compressed laser gain media 110 could also, by collision, compress and excite component gases towards the excitation. For example, if laser gain media 110 comprises a mixture of helium and neon, the helium is excited and transfers energy to the neon. A neutral gas 602 may surround plasma pinch 108 to provide flow stabilization to plasma pinch 108. For example, if plasma pinch 108 is a z-pinch, then the z-pinch may be stabilized using a sheared flow of neutral gas 602 that surrounds the z-pinch. In this embodiment, system 100 includes a magnetic shield 604 that is proximate to partially reflective mirror 102-2. Magnetic shield 604 generates a magnetic field that directs ionized laser gain media 606 away from partially reflective mirror 102-2. This prevents damage to partially reflective mirror 102-2 from plasma and/or ionized laser gain media 606 that escapes from opening 502. Coherent light 106 reflects back and forth across plasma pinch 108 and is amplified. Once coherent light 106 achieves a particular optical power, coherent light 106 exits optical resonator 102 via partially reflective mirror 102-2.

Figure 7:
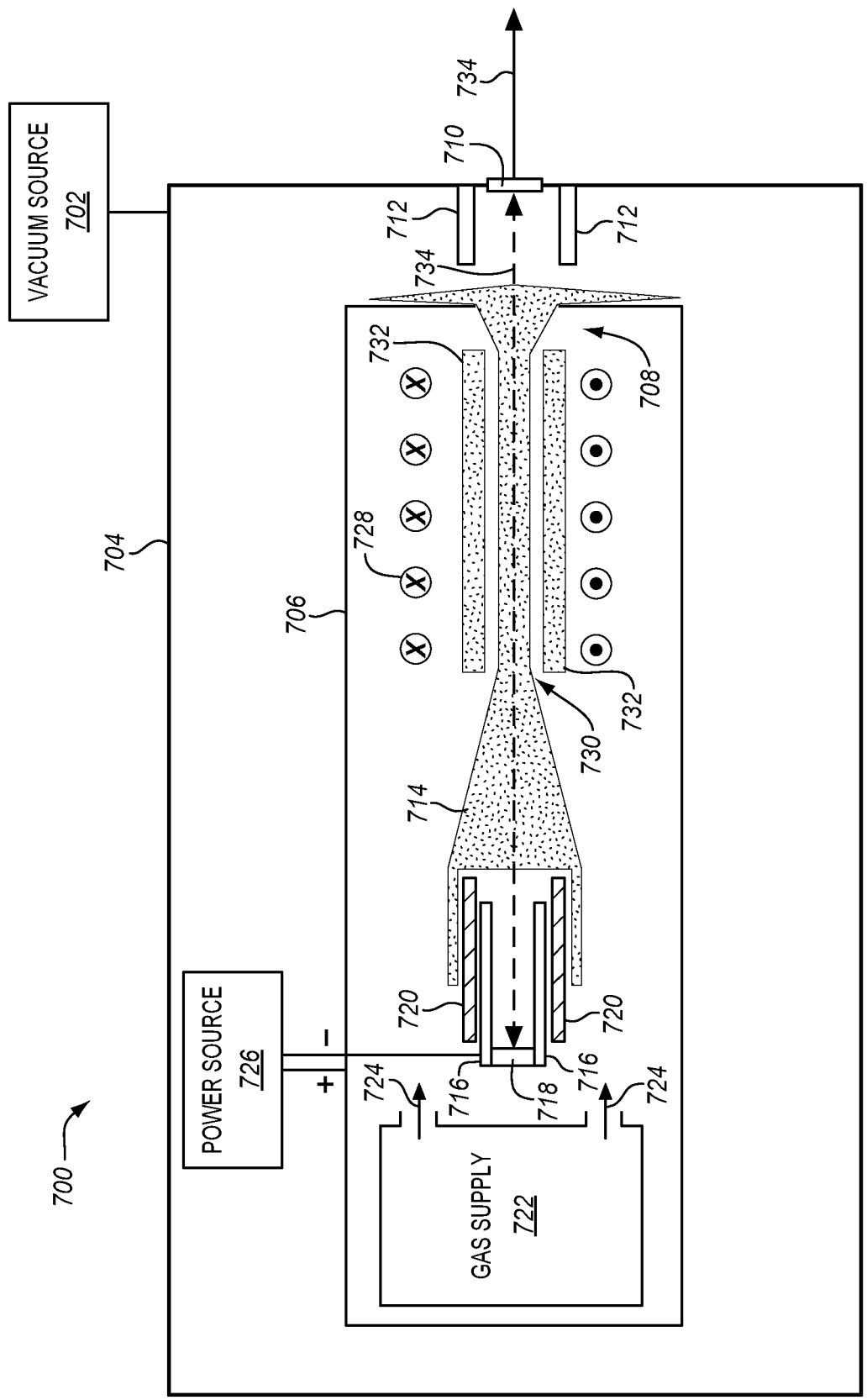
FIG. 7 illustrates another system that utilizes plasma confinement for laser gain-amplification in an illustrative embodiment.

FIG. 7 illustrates another system 700 that utilizes plasma confinement for laser gain-amplification in an illustrative embodiment. System 700 includes a vacuum source 702, which draws a vacuum on a vacuum chamber 704. Within vacuum chamber 704 is an outer electrode 706, which includes an opening 708. In this embodiment, opening 708 is in-line with a partially reflective mirror 710 that is located in a wall of vacuum chamber 704. Proximate to partially reflective mirror 710 is a magnetic shield 712 that generates a magnetic field that directs plasma 714 formed within outer electrode 706 away from partially reflective mirror 710.

System 700 further includes an inner electrode 716 that is centered within outer electrode 706. A reflective mirror 718 is located proximate to inner electrode 716 and is optically aligned with partially reflective mirror 710. Proximate to reflective mirror 718 is a magnetic shield 720 that generates a magnetic field that directs plasma 714 formed within outer electrode 706 away from reflective mirror 718. Some examples of magnetic shield 712 and/or magnetic shield 720 include permanent magnets and electromagnets.

A gas supply 722 provides a laser gain media 724 proximate to inner electrode 716. Laser gain media 724 may be similar to laser gain media 110, previously described with respect to system 100. When a voltage differential is applied to outer electrode 706 and inner electrode 716 utilizing a power source 726, an electric arc forms (not shown, but previously described with respect to system 100), which participates in the formation of a magnetic field 728 within the center of outer electrode 706 as current flows from the opening 708 of outer electrode 706 back towards inner electrode 716. Plasma 714 formed from ionized atoms of laser gain media 724 is compressed by magnetic field 728 to form a plasma pinch 730. A neutral gas 732 surrounds plasma pinch 730, providing flow stabilization to plasma pinch 730. For example, if plasma pinch 730 is a z-pinch, then the z-pinch may be stabilized using a sheared flow of neutral gas 732 that surrounds the z-pinch.

Collectively, partially reflective mirror 710 and reflective mirror 718 form an optical resonator, with the gain medium for the optical resonator comprising laser gain media 724 formed into plasma 714. Photons emitted by laser gain media 724 in the form of plasma 714 form coherent light 734, which reflects back and forth between reflective mirror 718 and partially reflective mirror 710 through plasma pinch 730. Coherent light 734 will reflect back and forth between partially reflective mirror 710 and reflective mirror 718 through plasma pinch 730 multiple times, which allows plasma pinch 730 to continue to amplify coherent light 734 until a threshold optical power is reached. Upon reaching the threshold optical power, coherent light 734 exits partially reflective mirror 710 and vacuum chamber 704.

Figure 8:
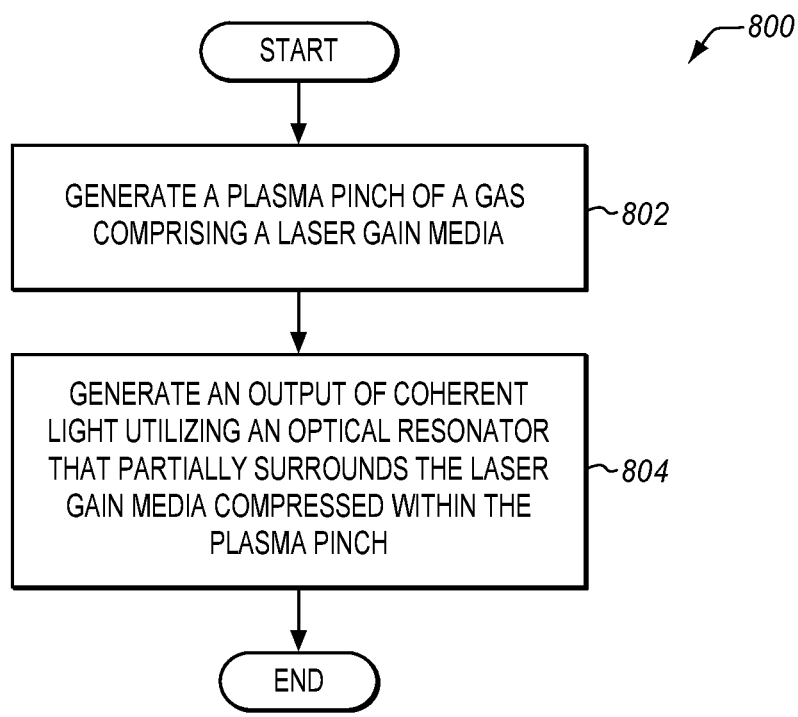
FIG. 8 is a flow chart of a method of providing laser-gain amplification utilizing a plasma pinch in an illustrative embodiment.

FIG. 8 is a flow chart of a method 800 of providing laser-gain amplification utilizing a plasma pinch in an illustrative embodiment. The steps of method 800 will be discussed with respect to system 100 and/or system 700, although method 800 may apply to other systems not shown. Method 800 may include other steps not shown, and the steps may be performed in an alternate order.

During operation of system 100 (see FIG. 1), plasma confinement device 104 operates to squeeze or compress laser gain media 110 into a highly dense state to generate plasma pinch 108 (see step 802). To do so, plasma confinement device 104 may utilize magnetic fields or other mechanisms to compress laser gain media 110 into this state. For instance, plasma confinement device 104 may convert laser gain media 110 into a plasma, which conducts an electric current. Current flowing through the plasma creates a magnetic field within plasma confinement device 104 that squeezes or compresses laser gain media 110 to form plasma pinch 108. In this form of plasma confinement, plasma pinch 108 may be self-reinforcing, with the current flowing through plasma pinch 108 generating a magnetic field, and the magnetic field in turn further compressing the plasma formed from laser gain media 110 in the region of plasma pinch 108. Generally, the density of the plasma formed from laser gain media 110 within plasma pinch 108 varies based on the current, with an increasing current through plasma pinch 108 generating a magnetic field of increasing strength. Optical resonator 102 generates an output of coherent light 106 utilizing laser gain media 110 compressed within plasma pinch 108 (see step 804).

Figure 9:
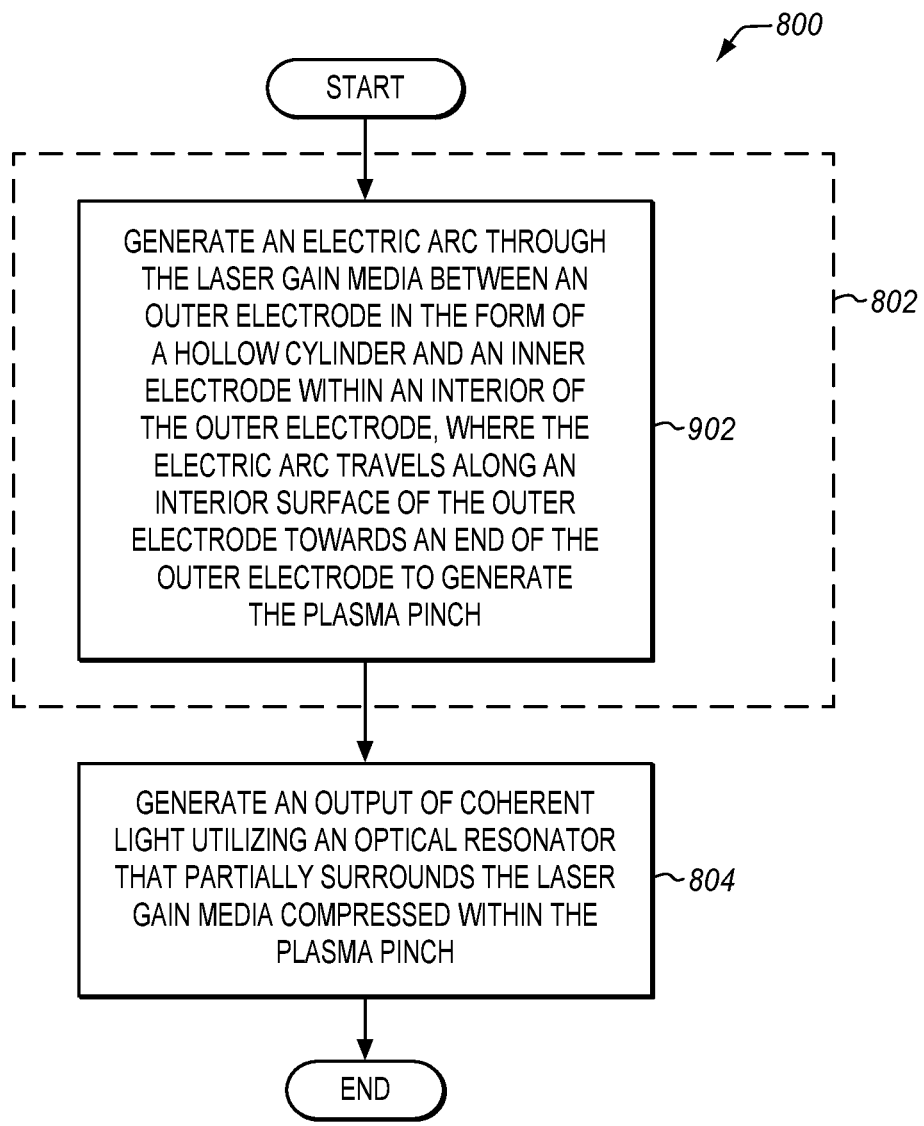
FIGS. 9-13 illustrate additional details for the method of FIG. 8 in an illustrative embodiment.
Figure 10:
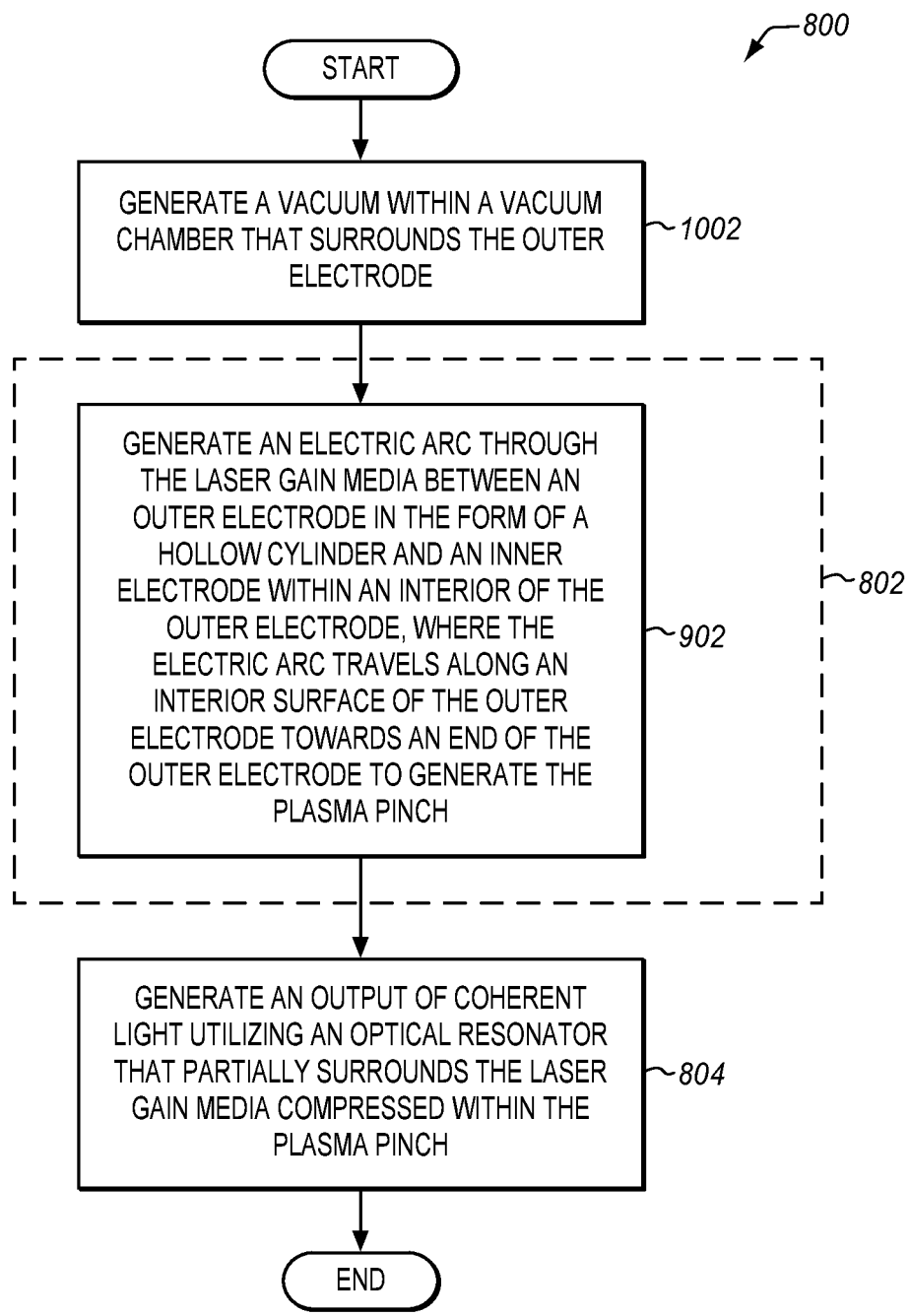
Figure 11:
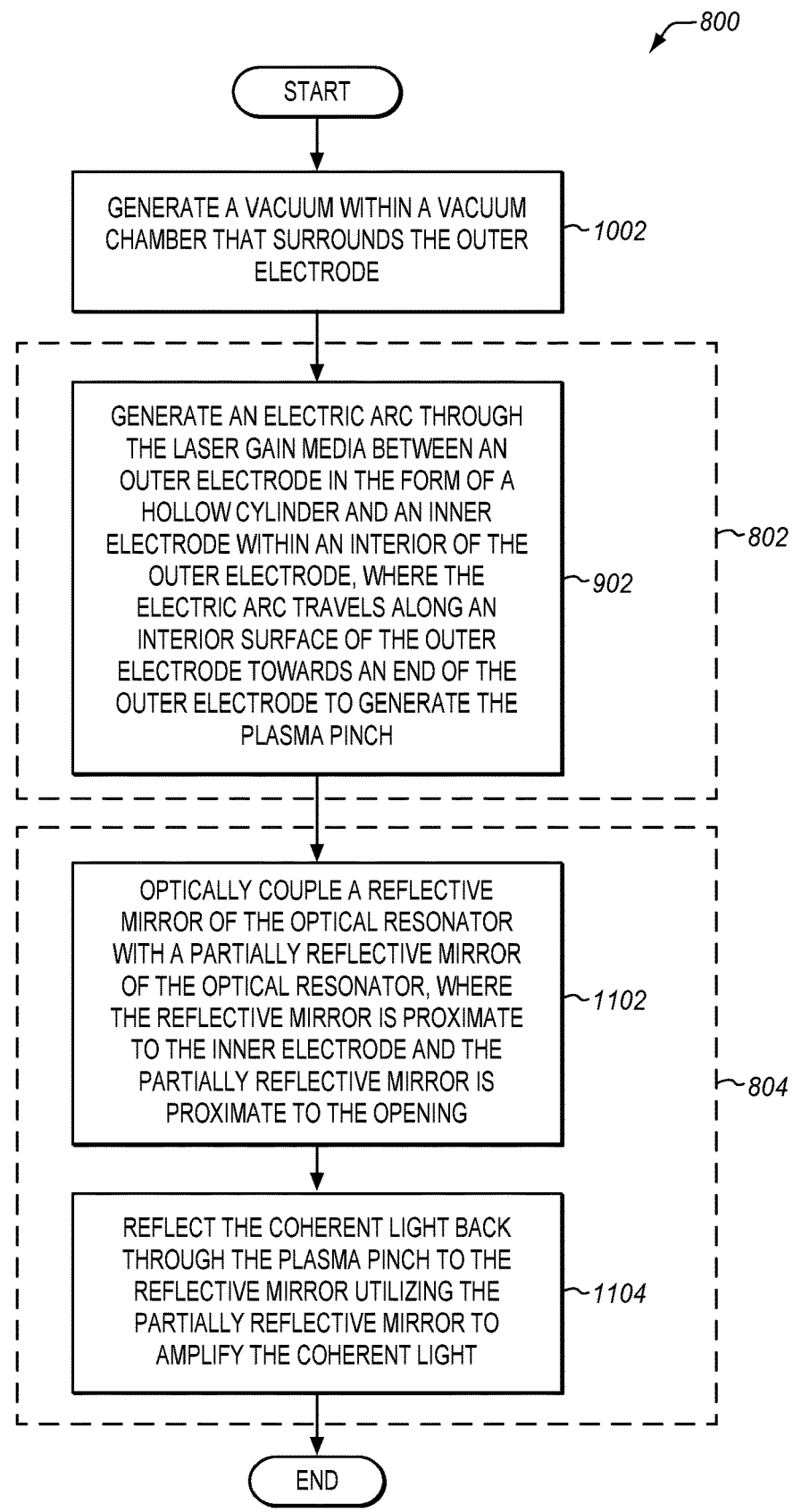

FIGS. 9-13 illustrates additional details of method 800 in illustrative embodiments. FIG. 9 describes generating an electric arc (e.g., electric arc 302) through laser gain media 110 between an outer electrode (e.g., outer electrode 202) in the form of a hollow cylinder and an inner electrode (e.g., inner electrode 204) within an interior of the outer electrode. The electric arc travels along an interior surface of the outer electrode (e.g., interior surface 402) towards an end of the outer electrode (e.g., end 404) to generate plasma pinch 108 (see step 902 of FIG. 9). FIG. 10 describes generating a vacuum within a vacuum chamber (e.g., vacuum chamber 210) that surrounds the outer electrode (see step 1002). FIG. 11 describes optically coupling a reflective mirror (e.g., reflective mirror 102-1) of an optical resonator with a partially reflective mirror (e.g., partially reflective mirror 102-2) of the optical resonator. The reflective mirror is proximate to the inner electrode and the partially reflective mirror is proximate to the opening (see step 1102 of FIG. 11). FIG. 11 further describes reflecting coherent light 106 back through plasma pinch 108 to the reflective mirror using the partially reflective mirror (see step 1104 of FIG. 11).

Figure 12:
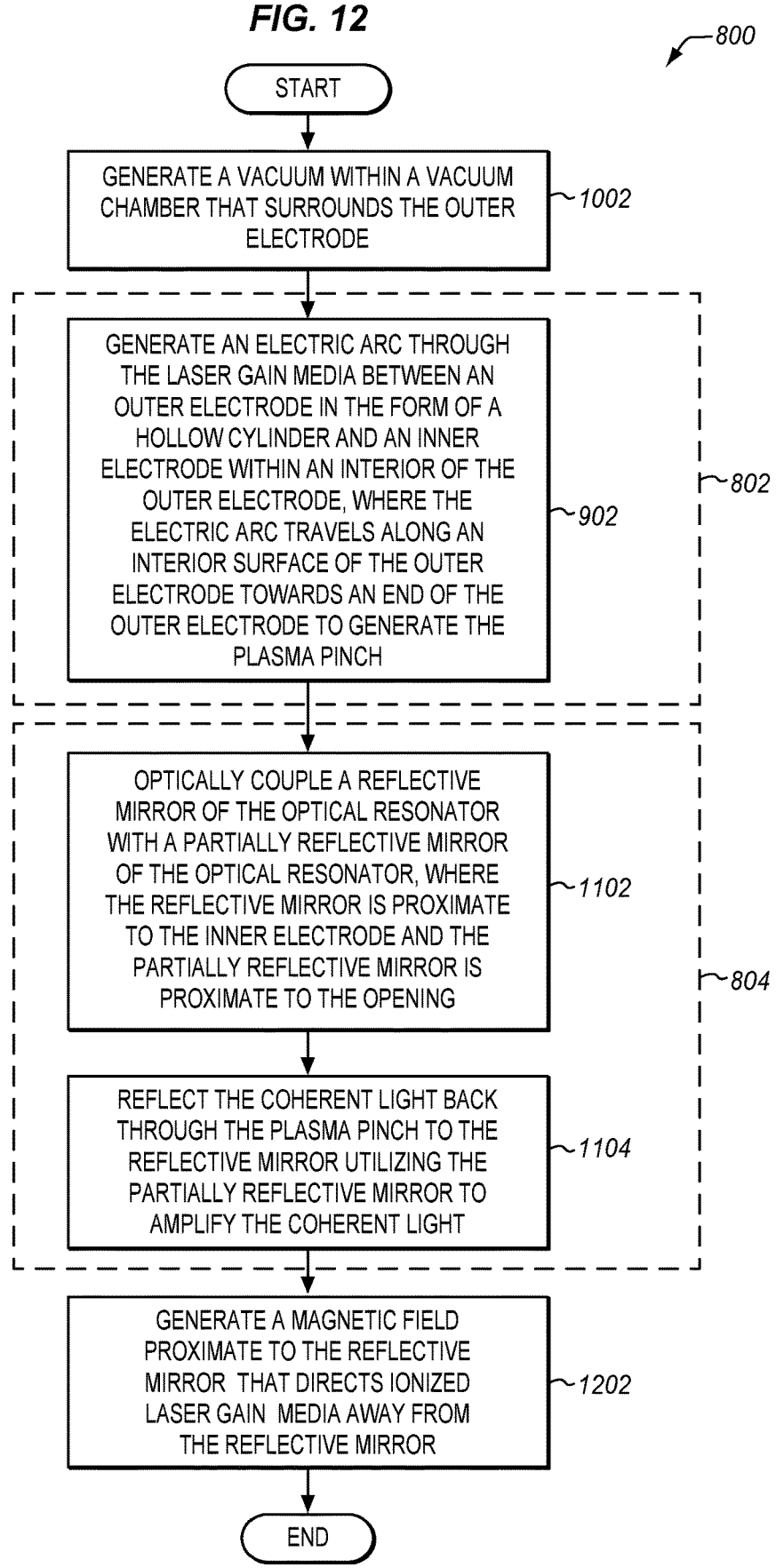
Figure 13:
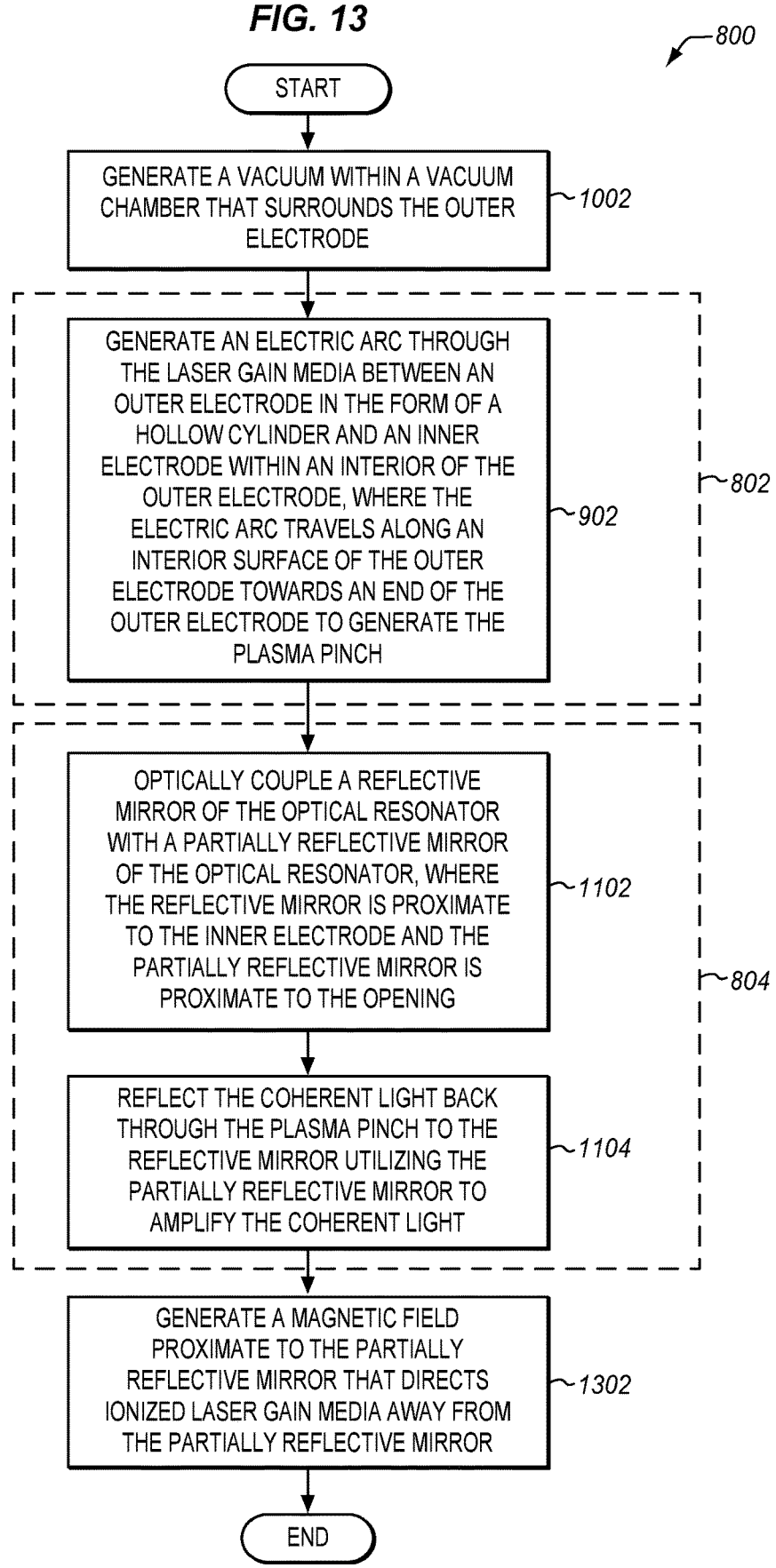

FIG. 12 describes generating a magnetic field proximate to the reflective mirror that directs ionized laser gain media 110 away from the reflective mirror, while FIG. 13 describes generating a magnetic field proximate to the partially reflective mirror that directs ionized laser gain media 110 away from the partially reflective mirror (see step 1202 and step 1302, respectively). For example, magnetic shield 720 directs plasma 714 away from reflective mirror 718, while magnetic shield 712 directs plasma 714 away from partially reflective mirror 710 (see FIG. 7).

As discussed previously, laser gain media 110 within the region of plasma pinch 108 is compressed to a high density. The result is that a larger number of gas atoms are available to participate in an excited state, which increases the optical gain provided by laser gain media 110. For instance, it would be expected that as the density of laser gain media 110 increases, the optical gain also increases. Therefore, the optical gain available to plasma confinement device 104 may only be limited by the ability to generate highly compressed states of laser gain media 110 within plasma pinch 108.

Further, systems 100 and/or system 700 does not incur some of the drawbacks that are typically associated with high power laser systems. For instance, a crystal laser generally absorbs energy during optical pumping, which generates heat within the crystal. This limits the amount of optical pumping that can be applied to the crystal, which in turn limits the optical output power of a crystal laser. Gas lasers generally include a low-pressure gas, which is electrically pumped. However, due to their low pressure, far fewer gas atoms are available to participate in the excited state, which results in a low energy density for a typical gas laser. Due to the highly compressed region of laser gain media 110 within plasma pinch 108, system 100 (and/or system 700) provide a high optical gain.

Although specific embodiments were described herein, the scope is not limited to those specific embodiments. Rather, the scope is defined by the following claims and any equivalents thereof.

What is claimed is:

1. An apparatus comprising:
a plasma confinement device configured to generate a plasma pinch of at least one gas of a laser gain media, wherein the plasma confinement device comprises:
an outer electrode in a form of a hollow cylinder;
an inner electrode within an interior of the outer electrode; and
a power source electrically coupled to the outer electrode and the inner electrode that is configured to generate an electric arc between the outer electrode and the inner electrode through the laser gain media, wherein the electric arc travels along an interior surface of the outer electrode towards an end of the outer electrode to generate the plasma pinch; and
an optical resonator partially surrounding the plasma pinch that is configured to utilize the laser gain media compressed within the plasma pinch to generate an output of coherent light.

2. The apparatus of claim 1, further comprising:
a vacuum chamber that surrounds the outer electrode, and
a vacuum source configured to generate a vacuum within the vacuum chamber.

3. The apparatus of claim 2, wherein:
the inner electrode is centered within the interior, and
the plasma pinch is generated centrally within the interior between the inner electrode and an opening through the end of the outer electrode.

4. The apparatus of claim 3, wherein the optical resonator comprises:
a reflective mirror proximate to the inner electrode; and
a partially reflective mirror proximate to the opening that is configured to reflect the coherent light back through the plasma pinch to the reflective mirror to amplify the coherent light.

5. The apparatus of claim 4, further comprising:
a magnetic shield proximate to the reflective mirror that is configured to generate a magnetic field that directs ionized laser gain media away from the reflective mirror.

6. The apparatus of claim 5, wherein:
the magnetic shield comprises permanent magnetic material.

7. The apparatus of claim 5, wherein:
the magnetic shield comprises an electromagnet.

8. The apparatus of claim 4, further comprising:
a magnetic shield proximate to the partially reflective mirror that is configured to generate a magnetic field that directs ionized laser gain media away from the partially reflective mirror.

9. The apparatus of claim 8, wherein:
the magnetic shield comprises permanent magnetic material.

10. The apparatus of claim 8, wherein:
the magnetic shield comprises an electromagnet.

11. The apparatus of claim 1, further comprising:
a gas supply configured to provide the laser gain media to the interior.

12. The apparatus of claim 1, wherein:
the inner electrode is centered within the interior, and
the plasma pinch is generated centrally within the interior between the inner electrode and an opening through the end of the outer electrode.

13. The apparatus of claim 1, wherein:
the plasma pinch comprises a flow stabilized z-pinch.

14. A method comprising:
generating a plasma pinch of at least one gas of a laser gain media, by:
generating an electric arc through the laser gain media between an outer electrode in a form of a hollow cylinder and an inner electrode within an interior of the outer electrode, wherein the electric arc travels along an interior surface of the outer electrode towards an end of the outer electrode to generate the plasma pinch; and
generating an output of coherent light utilizing an optical resonator that partially surrounds the laser gain media compressed within the plasma pinch.

15. The method of claim 14, further comprising:
generating a vacuum within a vacuum chamber that surrounds the outer electrode.

16. The method of claim 15, wherein:
the inner electrode is centered within the interior; and
generating the plasma pinch further comprises:
generating the plasma pinch centrally within the interior between the inner electrode and an opening through the end of the outer electrode.

17. The method of claim 16, wherein generating the output of coherent light further comprises:
optically coupling a reflective mirror of the optical resonator with a partially reflective mirror of the optical resonator, wherein the reflective mirror is proximate to the inner electrode and the partially reflective mirror is proximate to the opening; and
reflecting the coherent light back through the plasma pinch to the reflective mirror utilizing the partially reflective mirror to amplify the coherent light.

18. The method of claim 17, further comprising:
generating a magnetic field proximate to the inner electrode that directs ionized laser gain media away from the reflective mirror.

19. The method of claim 17, further comprising:
generating a magnetic field proximate to the partially reflective mirror that directs ionized laser gain media away from the partially reflective mirror.

20. An apparatus comprising:
an outer electrode in a form of a hollow cylinder having an end with an opening;
an inner electrode in a form of a hollow cylinder that is centered within an interior of the outer electrode;
at least one gas supply configured to provide a laser gain media to the interior;
a power source electrically coupled to the outer electrode and the inner electrode that is configured to generate an electric arc between the outer electrode and the inner electrode, wherein the electric arc travels along an interior surface of the outer electrode towards the opening to form a plasma pinch between the inner electrode and the opening;
a reflective mirror within the inner electrode;
a partially reflective mirror proximate to the opening that is optically coupled to the reflective mirror;
a first magnetic shield proximate to the reflective mirror that is configured to generate a magnetic field that directs ionized laser gain media away from the reflective mirror; and
a second magnetic shield proximate to the partially reflective mirror that is configured to generate a magnetic field that directs ionized laser gain media away from the partially reflective mirror.

21. The apparatus of claim 20 further comprising:
a vacuum chamber that surrounds the outer electrode; and
a vacuum source configured to generate a vacuum within the vacuum chamber.

22. The apparatus of claim 20, wherein:
at least one of the first magnetic shield and the second magnetic shield comprises permanent magnetic material.

23. The apparatus of claim 20, wherein:
at least one of the first magnetic shield and the second magnetic shield comprises an electromagnet.

* * * * *